United States Patent [19]
Iwasaki

[11] Patent Number: 5,723,360
[45] Date of Patent: Mar. 3, 1998

[54] METHOD OF PROCESSING AN EPITAXIAL WAFER OF InP OR THE LIKE

[75] Inventor: Takashi Iwasaki, Osaka, Japan

[73] Assignee: Sumitomo Electric Industries, Ltd., Osaka, Japan

[21] Appl. No.: 603,089

[22] Filed: Feb. 20, 1996

Related U.S. Application Data

[63] Continuation of Ser. No. 370,409, Jan. 9, 1995, abandoned.

[30] Foreign Application Priority Data

Jan. 12, 1994 [JP] Japan .................. 6-014831

[51] Int. Cl.$^6$ .................................. H02L 21/20
[52] U.S. Cl. .................. 437/107; 437/126; 437/129; 117/93; 117/97
[58] Field of Search .................. 437/107, 126, 437/129; 117/93, 97

[56] References Cited

PUBLICATIONS

Ohkura et al., Electronics Letters, "Low Threshold FS–BH Laser On p–InP Substrate Grown by All–MOCVD", vol. 28, No. 19, Sep. 10, 1992, pp. 1844–1845.

Kimura et al., Mitsubishi Denki GIHO, "Technology of Growing InP Buried Layers by MOCVD (Metallo Organic Chemical Vapor Deposition) Method", vol. 67, No. 8, Aug. 25, 1993, pp. 88–91.

Optical Communication Handbook, First Edition Date: Sep. 1, 1982, Third Edition Date: May 20, 1988, Editor: Hisayoshi Yanai, Publisher: Kunizo Asakura, Asakura Shoten Co., Ltd.

Turley et al., "LPE Growth on Structured (100) InP Substrates and Their Fabrication by Preferential Etching", Journal of Crystal Growth, vol. 58, 1982, pp. 409–416.

Adachi et al., "Chemical Etching Characteristics of (001) InP", J. Electrochem. Soc.: Solid–State Science and Technology, vol. 128, No. 6, Jun. 1981, pp. 1342–1349.

Harrous et al, "Effect of Phosphine Decomposition on the Growth and Substrate Heating of (100) InP In the Hydride Method", Journal of Crystal Growth, vol. 83 (1987), pp. 279–285.

*Primary Examiner*—Robert Kunemund
*Attorney, Agent, or Firm*—Cushman Darby & Cushman IP Group of Pillsbury Madison & Sutro LLP

[57] ABSTRACT

Fine processing of InP epitaxial wafers including As, In and P for producing laser diodes, light emitting diodes or photodiodes. The InP epitaxial wafer is selectively covered with striped protection mask films. The wafer is etched by some etchant which forms normal-mesas or mountain-shaped stripes under the masks. Then the wafer is again etched by a gas of thermally dissolved $AsCl_3$ till the stripes have rectangle sections with erect surfaces. Buried layers of InP are grown on the eliminated parts of the wafer.

11 Claims, 3 Drawing Sheets

5,723,360

METHOD OF PROCESSING AN EPITAXIAL WAFER OF INP OR THE LIKE

This is a continuation of application Ser. No. 08/370,409, filed on Jan. 9, 1995, which was abandoned upon the filing hereof.

FIELD OF THE INVENTION

This invention relates to a method of processing an epitaxial wafer of InP or the like for fabricating light emitting devices or photodetectors of InP or the like, and more particularly to a method of mesa-etching and growth of the buried layers without degenerating crystalline properties of the semiconductor. Here the photodetector means a photodiode, an avalanche photodiode or the like. The light emitting device means a light emitting diode, a laser diode, etc.

BACKGROUND OF THE INVENTION

This application claims the priority of Japanese Patent Application No. 014831/1994 filed Jan. 12, 1994, which is incorporated herein by reference.

InP and the like semiconductors are employed as light emitting devices or photodetectors of the optoelectronic communication. The InP semiconductors, in general, are produced by growing a plurality of InP films or the like on an InP substrate wafer epitaxially, processing the multilayered films microscopically, making desired functions on the crystals, forming electrodes, chipping (or scribing) the wafer into a plurality of individual device chips and assembling these chips in packages enabling the semiconductor device chips to couple optical fibers.

For example, a laser diode for the optoelectronic communication is made by epitaxially-growing an active layer and other layers of InP, InGaAsP, etc. having double-hetero junctions of InP, InGaAs, InGaAsP, etc. on an InP substrate wafer. Then the active layer and other layers are selectively etched into a mesa-shaped section in which the tops of the unetched parts align along parallel stripes. The etched cavities beside the mesa tops are covered with newly grown crystals. The newly grown crystals are called "buried layers". This laser is called a "buried hetero-junction type laser".

The word "mesa" means originally a plateau. When both the sides of top stripes are eliminated by the etching, the remainders are shaped like trapezoids similar to plateaus. Thus the remaining parts are called mesas or mesa-stripes. The eliminated cavities are filled up with the crystals grown epitaxially again. The devices were named a buried type after burying the once etched parts with the newly-grown layers. Photodetectors and light emitting devices of the buried type are generally explained, for example, by;

① Handbook of optoelectronic communication (Publisher: Asakura Shoten, Co., Ltd. Publication date: Third printing, May 20, 1988.)

② S. E. H. Turley & P. D. Greene, "LPE Growth on Structured {100} InP Substrate and Their Fabrication by Preferential Etching", J.Crystal Growth 58 p409–416(1982)

③ S. Adachi & H. Kawaguchi, "Chemical Etching Characteristics of (001) InP", J.Electrochem. Soc.:Solid-State Science and Tech.vol. 28,No.6, p1342(1981)

InP laser diodes have mainly been fabricated by etching an epitaxial wafer with an etchant including HBr, e.g. HBr alone, $HBr+H_2O_2+H_2O$, $HBr+CH_3COOH+H_2O$, $HBr+H_3PO_4+H_2O$, $HBr+HNO_3+H_2O$, etc. All the laser diodes being practically used now are processed by the HBr etching in the wafer process. HBr is an excellent etchant for InP. HBr gives a mountain-like section to the stripes by the etching. Both the sides of the etched surfaces are slanting. The section of the stripe has a longer bottom and a narrower top. The slopes are sometimes steep but not strictly vertical. Many wafers are collectively etched in a HBr liquid bath. The degrees of etching are non-uniform for the wafers. In some cases, the wafers near the center of the etching bath are insufficiently etched. In other cases, the wafers near the center of the etchant bath are excessively etched. Since the sections of the stripes have slanting surfaces, the widths of the top layers are sensitive to the degree of the etching on the sides. The fluctuation of the width $\Delta w$ of the top is given by $\Delta e/\sin \theta$, where $\Delta e$ is the under- or over-etching depth, and $\theta$ is the slanting angle of the slope. $\theta=90$ degrees is the best condition for minimizing the change of the width $\Delta e$ of the top layer which will make a contact with an electrode. The HBr etching is still prevailing for processing an epitaxial wafer of InP, and all the InP lasers have been produced by the HBr wet etching. The Inventors, however, are not contented with the HBr etching yet, because the HBr etching often causes a great fluctuation of the widths of the top layers due to the slanting stripes.

Thus, the Inventors have a desire to make erect sections of stripes by an improvement of etching method, because such erect surfaces should make the width of the top layers less sensitive to the degrees of etching. A mixture of bromine ($Br_2$) and methanol has been known as an etchant capable of revealing (111)A surfaces. Some people had suggested a formation of reverse-mesas by the mixture ($Br_2+CH_3OH$), because the reverse-mesas had been once deemed to be a suitable shape for the stripes. However, the reverse-mesa method by "Br-methanol etchant ($Br_2+CH_3OH$)" failed in making a laser diode which satisfied the requirements for the device. Actually InP makers scarcely employ the "Br-methanol" etching in the real processes for making inP lasers. The "Br-methanol" etching cannot be called prior art in a rigorous meaning of the word. Although the "Br-methanol" etching has seldom been employed as an actual production of laser diodes, this invention will adopt the "Br-methanol" etching as a part. Then the method of the "Br-methanol etching" and the problems of the "Br-methanol etchant" mesas should be explained now.

General processing of InP epitaxial wafer is firstly demonstrated. The mesa-stripes of the devices are produced by the steps of masking striped parts on the multilayers of an InP epitaxial wafer with protecting films, dipping the wafer into the mixture etchant and etching away the unmasked side parts till the active layer appears. The parts masked with the protecting films remain unetched in stripes. The section of the remaining part looks like a mesa. Thus the parts are often called mesa-striped parts. The sides of the stripes are cavities which reveal the ends of the active layers on the side walls. Then other InP multilayers are grown on the revealed parts till the side cavities are filled up with the newly grown InP layers by a liquid phase or vapor phase epitaxial method. In the meantime, the striped parts are not covered with the InP layers because the striped parts are protected by the protecting films which play the role of a mask in the burying process. The newly grown layers are called "buried layers" which build a pn-junction in the reverse direction. When the device is used as a light emitting device, the pn-junction in the side buried layers is reversely biased and no current flows in the buried layers due to the reverse pn-junction. The side buried portions become a current-preventing portion. A type of electrodes are formed on the narrow stripes. Another type of electrodes are formed on the bottoms of the substrates. When a voltage is applied between the stripe electrode and the bottom electrode, a current is restricted in the narrow mesa portion, because the side buried parts are reversely biased by their pn-junctions in a unit of device.

Mesa portions of InP crystals are shaped by etching the masked InP multilayer crystal with, e.g. HBr or a mixture liquid of bromine and methanol which can solve and eliminate InP or the like. Etched mesas are further classified by the shape into two categories. One Is a normal-mesa which is a stable trapezoid with a top narrower than a bottom. The other is a reverse-mesa which is an unstable trapezoid with a top wider than a bottom. The direction of mesas depends on crystallographical orientations of the multilayers and the substrate. The direction of normal-mesas is perpendicular to the direction of the reverse mesas on a (100) plane of the compound semiconductor crystals of groups III–V. For fabricating light emitting devices, the reverse mesa had been proposed for the sectional shape of the striped parts, as explained in the prior document ③. The ground of employing the reverse-mesa is now clarified.

The active layer, which is a non-doped or little doped InGaAs or InGaAsP thin film sandwiched by higher doped InP cladding layers, generates photons by the recombination of injected electrons and holes. In general, a narrower width of the active layer can heighten the density of an injected current. It is preferable to restrict the width of the active layer to about 1 μm. However, size errors of the stripe lines on a mask impede to limit the width of the active layer less than 1 μm. The reverse-mesa is more suitable for limiting the width of the active layer than the normal-mesa, because the reverse mesa enables the stripe lines on a mask to make active layers of a width narrower than the lines themselves. The wider top of the reverse-mesa corresponds to the protecting film produced by the transcription of the mask stripes. The narrower bottom of that corresponds to the active layer. The formation of the active layers narrower than the mask stripes is the advantage of the adoption of the reverse-mesa to select the sectional shape of the striped parts.

Some difficulties, however, accompany the reverse-mesa. When the compound semiconductor is etched in the direction of the reverse-mesa, (111)A planes are revealed because of the anisotropic differences of the etching speed in various crystallographical directions. A (111) plane is a plane which is occupied either only by the element of group III or only by the element of group V. One (111) plane which has only the atoms of group III is called a (111)A plane. The other (111) plane on which the atoms of group V align in two-dimensional directions is called a (111)B plane. When a crystal is cut in a (111)A plane, the atoms (In, Ga, etc.) of group III appear in the surface. The elements (In, Ga, etc.) of group III are likely to be oxidized by oxygen in the air or in the aerobic atmosphere. The oxidation is enhanced further by heating. The (111)A surfaces are likely to be oxidized in hot aerobic atmosphere. Thus (111)A planes are vulnerable to thermal damage. This is one reason why the Inventors want to avoid the reverse-mesa etching by the "Br-methanol etchant". Further, the "Br-methanol etchant" reverse-mesa etching had another disadvantage.

If stripes were made by forming reverse-mesas on a multilayered surface of a compound semiconductor, (111)A planes would be revealed. The (111)A planes are likely to be impaired thermally in the following epitaxy process for filling the etched side cavities with buried layers. The thermal damage of the (111)A planes sometimes causes partial destruction of the crystal structure of the narrow reverse-mesa. Thus the sections of the narrowest portions of the reverse mesas would come to take various shapes unexpected. The final sectional shapes of the underlying layers beneath the stripe masks would often deviate from the designed ones. The shapes in the vicinity of the active layers may become unstable. The fluctuation of the sections of the reverse-mesas prevents the formation of suitable current-stopper layers in the side buried layers. The maladjustment of the buried layers would incur the difficulty of controlling the injection current. Thus the semiconductor lasers produced by this method would be likely to suffer from the difficulty of controlling the emission properties. No manufactures have, therefore, adopted the "Br-methanol" etching in the actual fabrication processes yet.

The present invention makes use of the chloride method for etching as well as the "Br-methanol" etching which has been clarified till now. To distinguish the features of the present invention from that of the once proposed "Br-methanol" etching, an imaginary application of the chloride etching following to the "Br-methanol etchant" reverse-mesa will be explained later.

Processes of filling etched cavities up by the chloride method are explained by referring to FIG. 1 to FIG. 4 in order to clarify the difficulties mentioned more intuitively. FIG. 1 shows a section per one device unit of an epitaxial wafer. Although the following treatments will be collectively done on a wafer, the figures show only a part per a device unit of the wafer in process, because the sectional view is only repetitions of the basic unit. The sides of the section continue to the sides of neighboring units in all the figures. Actually many wafers are etched by a liquid etchant in an etching bath at the same time. FIG. 1 shows an n-type InP substrate (1), an n-type InP cladding layer (2), a non-doped InGaAs or InGaAsP active layer (3), and a p-type InP cladding layer and a p-type InP cap layer (4). The cladding layers (2), the active layer (3), and the p-type cladding layer and InP cap layer (4) are grown epitaxially on the n-type substrate (1). (4) denotes both the p-type cladding layer and the p-type cap layer. A SiN striped film (5) is deposited in the middle of the unit on the p-type cap layer. The striped film (5) extends in the direction vertical to the section in FIG. 1. Since an assembly of narrow lines extends in parallel with the same distance across in the middle of the units, the line is called a stripe. The striped film (5) acts as a mask which protects the underlying layers from the etchant. The epitaxial wafer is first etched by a mixture of bromide ($Br_2$) and methanol ($CH_3OH$). The etchant ($Br_2+CH_3OH$) is often called "Br-methanol etchant". The etching is sometimes named "Br-methanol-etching" briefly.

FIG. 2 denotes the section after the "Br-methanol-etching". Both sides of the epitaxial layers (4), (3) and (2) have been deeply eliminated away till the InP substrate (1). There remains the middle stripe protected by the mask film (5). Side surfaces (6) of the p-type layer (4), the active layer (3) and the n-type layer (2) incline downward. The revealed slanting surfaces (6) are (111)A planes which include only In atoms. The slanting (111)A plane (6) is terminated at the narrowest point (7). Then the section depicts curves (8) which are (111)B planes in the substrate (1). Almost all the entire surface of the substrate (1) has been removed till the transient surfaces (9). Since the etching proceeds along a normal of (111)A plane, the rear parts of the mask film (5) have been also etched away partly. Eaves (10) of the mask film (5) are now prominent in horizontal directions due to the over-etching of the underlying layers. The revealed (111)A surfaces (6) are liable to be thermally damaged. Then the eliminated cavities (11) will be filled by growing buried layers in the following processes of making optoelectronic devices. Thus FIG. 1 and FIG. 2 correspond to imaginary processes of manufacturing laser diodes through the reverse-mesa by "Br-methanol" etching, which had been suggested by some researchers but had abandoned because of the incontrollability of an injection current caused by the fluctuation of breadths of the stripes.

FIG. 3 and FIG. 4 are furthermore only imaginary views of the sections after the imaginary etching by $AsCl_3$. If the wafer shown in FIG. 2 were further etched by another etchant, arsenic trichloride ($AsCl_3$) which this invention will propose, the sides of the underlying layers (4), (3) and (2) just below the mask (5) would be eliminated in triangle sections (12), as shown in FIG. 3. Then the reverse-mesa would disappear. Newly appearing surfaces (13) would incline upward. Only a narrow top (14) of the cap layer (4) would support the protecting film (5). The caves (10) would be extended further. The multilayers are almost fully eliminated except the middle narrow parts. Further, if light emitting devices were fabricated by growing buried layers (15), (16) and (17) in the cavities (11) on the substrate (1), too narrow epitaxial layer (4) beneath the stripes (5) could not produce an good ohmic contact with an electrode. Such a poor contact would impede a current from flowing in the epitaxial layers vertically. Insufficient current supply would impair the action of a laser diode. Thus the "Br-methanol etchant" reverse-mesa followed by a chloride etching is fully inoperative.

FIG. 2 denotes not real prior art but only imaginary prior art, because nobody adopts such a "Br-methanol etchant" reverse-mesa now. FIG. 3 and FIG. 4 are also imaginary views.

HBr and the like are unique etchants which have been actually used for the fabrication of laser diodes of InP and the like.

RIE (reactive ion etching) may be deemed to be promising for the etching of stripes of InP lasers, because the dry etching can make clear stripes having vertical side surfaces by taking advantage of the vertical incidence of ion beams to the wafers. The wafers will, however, be contaminated in the air after the dry etching before being carried into an epitaxial chamber. Thus the dry etching by $CCl_4$, etc. has never been realized in the process of etching epitaxial wafers for the fabrication of InP lasers.

OBJECTS AND SUMMARY OF THE INVENTION

An object of the present invention is to provide a method of processing epitaxial wafers of compound semiconductors, wherein the epitaxial crystals are protected from thermal damage in the process of depositing the buried layers.

Another object of the present invention is to provide a method of processing epitaxial wafers, wherein mesas having rectangular sections with vertical surfaces are formed.

A further object of the present invention is to provide a method suitable for designing the widths of active layers under the stripes.

A still further object of the present invention is to provide a method which improves the property of the interfaces between the striped parts and the buried parts.

This invention includes the steps of: forming protecting mask films selectively on an epitaxial wafer of group III–V semiconductors containing InP, InAsP or the like, etching the surfaces of the crystals not covered with the protecting mask films by some etchant for shaping the stripes into normal-mesas or mountain-like sections, etching the side surfaces into rectangular sections by a gas of thermally dissolved $AsCl_3$, and growing buried layers of the compound semiconductors to fill the etched cavities. The etching by $AsCl_3$ characterizes this invention.

In more detail, the processing of this invention contains the steps of forming protecting mask films selectively on an epitaxially grown crystal of group III–V semiconductor containing InP, InAsP or the like, etching the surfaces of the crystal not covered with the mask films by a mixture of bromine and methanol for shaping the stripes into normal-mesas, revealing (111)A planes of the normal-mesas, etching the stripe crystals into rectangle sections further by a gas of $AsCl_3$ thermally dissolved, and forming epitaxially buried layers in the etched cavities which become current-stoppers.

Furthermore, the processing of this invention contains the steps of forming protecting mask films selectively on an epitaxially grown (100) crystal of group III–V semiconductor containing InP, InAsP or the like, etching the surfaces of the crystal not covered with the mask films by a mixture of bromine and methanol for shaping the stripe crystals into normal-mesas, revealing (111)A planes of the normal-mesas, etching the stripe crystals further into rectangular sections by a gas of $AsCl_3$ thermally dissolved, and forming epitaxially buried layers in the etched cavities.

In more detail, the processing of this invention contains the steps of forming protecting mask films striped in parallel with each other selectively on an epitaxially grown (100) crystal of group III–V semiconductor having a light emitting region of a double-hereto-junction containing InP, InAsP or the like, etching the surfaces of the crystal not covered with the mask films striped by a mixture of bromine and methanol for shaping the stripes into normal-mesas, revealing (111)A planes of the normal-mesas, etching the stripe crystals further by a gas of $AsCl_3$ thermally dissolved, and forming epitaxially buried layers of the compound semiconductor by a chloride vapor deposition method in the etched cavities which become current-stoppers.

Preferably the etching process shall be continually followed by the next vapor phase deposition without taking out the wafers from the chamber. If the wafer were taken out from the apparatus after the etching process and were transferred into another apparatus for the deposition of the buried layers, oxygen, gases or fumes would be likely to contaminate the wafer. Such a contamination can be avoided by carrying out the etching process and the epitaxial process in the same apparatus continually, which enhances the quality of the epitaxial layers.

Advantages of this invention are now explained. This invention processes an epitaxial wafer of InP or the like by the steps of etching an InP hetero-epitaxial wafer by the "Br-methanol etchant" into normal-mesas instead of the reverse mesas, revealing (111)A planes on the slopes of the normal-mesas, etching the wafer again by a mixture ($As_4$+ HCl) gas prepared by thermally dissolving $AsCl_3$, and growing buried layers on the sides of the mesas. This invention etches twice the InP epitaxial wafer. The first etching by "Br-methanol etchant" is a means for revealing normal-mesas enclosed by (111)A planes.

The first "Br-methanol" etching can be replaced by the well-used HBr etching. Here, the HBr etching designates the etching by chemicals including HBr, i.e. $HBr+H_2O_2+H_2O$, $HBr+CH_3COOH+H_2O$, $HBr+H_3PO_4+H_2O$, $HBr+HNO_3+H_2O$, etc.

The second etching by an $AsCl_3$ dissociation gas ($As_4$+ HCl) is novel and inherent in this invention. $As_4$ can suppress the P atoms as well as the As atoms from dissociating out of the epitaxial crystals. The As-atmosphere maintains the stoichiometry of the revealed epitaxial crystals during the etching. The suppression of P sublimation by As is one of the features of this invention, which will be later described again.

In general, the depth of etching is controlled by the gas density and the time in the case of a vapor phase etching. If the etching should be ended when the etching progresses at a high speed, high precision controllers and subtle measuring devices would be required. However, this invention dispenses with such a subtle, fine controlling. (111)A surfaces have higher etching speed than any other planes for the thermally dissolved $AsCl_3$ gas ($As_4$+HCl). On the contrary, (0±1±1) planes are the most resistant to the $AsCl_3$ gas. Thus the $AsCl_3$ gas eliminates the (111)A surface which has been revealed by "Br-methanol etchant" rapidly and the wave front of etching gradually becomes in parallel with a (0±1±1) plane. Finally, the wave front coincides with one of (0±1±1) plane which is the most difficult plane for $AsCl_3$ etching. Then the etching progresses slowly. Since a (100) epitaxial wafer is adopted, the final wave fronts (0±1±1) are cleavage planes orthogonal to the wafer surface. The $AsCl_3$ etching succeeds in making erect stripe parts beneath the masks. Such a rectangular section is the most desirable for the stripes, as clarified before. The width of the etched stripes is insensitive to the gas density and the etching time. The width depends mainly on the breadth of the mask and the breadth of the normal-mesa formed by the first "Br-methanol" etching. Comparison of FIG. 7 with FIG. 6 clarifies the determination of the final width of the stripe crystals by the mask breadth and the normal-mesa breadth. When the (0±1±1) planes appear once, the etching front is nearly stopped. The time and the density have little influence on the width of the stripe layers. This method enables to make the stripes of the same width with high reproductivity.

Furthermore, the etching by the thermally dissolved $AsCl_3$ gas reveals (0±1±1) surfaces which are resistant to heat instead of (111)A surfaces which are vulnerable to heat. The surfaces revealed by $AsCl_3$ are not damaged in the process of preheating the wafers for the epitaxy of buried layers. The surfaces of the stripes are maintained in order during the heating. The clean side surfaces of the stripes enable the buried crystals to grow in good alignment with the underlying layers. No void nor ruggedness occurs at the interface between the underlying layers and the buried layers.

Since the "Br-methanol" etching makes normal mesas, the underlying layers beneath the stripe masks are not so deeply etched by the $AsCl_3$ gas. The masks do not generate wide eaves projecting from the underlying layers. There is no need to eliminate the eaves of the masks. The omission of elimination of the eaves enables the wafers to be processed continually by the etching process and by the epitaxial process of the buried layers in the reaction chambers communicating through vacuum conduits. Since the wafers are not taken out in the air, they are not contaminated nor degraded by fumes, gases or other pollutants in the air. This invention brings about these excellent advantages.

The buried layer crystals of good quality are defined by:

① good interfaces between the original epitaxial crystals and the buried crystals newly grown.

② controlled sections of the buried layers.

This invention can satisfy the requirements ① and ②. ② signifies that the sectional shape of the stripe is exactly determined by the width of the masks and the "Br-methanol" etching, and the section of the buried layers is also determined by the width of the masks and the "Br-methanol" etching through the shape of the stripes. ① results from the following facts. This invention can grow the buried layers in the reaction chamber which is the same as the etching chamber or is connected with the etching chamber by vacuum conduits and by conveying machines. The wafers can be continually processed in the same vacuum. Continual processes curtail the time of cooling, transferring and heating, because the wafers need not be taken out in the air. Furthermore, the continuous processes bring about the following merits:

(a) Since the temperature of the wafers is little changed between the $AsCl_3$ etching and the epitaxial growth, little thermal stress occurs between the mesa crystals and the buried crystals. When the wafers are etched by the hot $AsCl_3$ gas, the wafers are heated at a high temperature $T_1$. When the buried layers are grown on the wafers, the wafers are also heated at a high temperature $T_2$. If $T_1$ is determined to be equal to $T_2$, the temperature of the wafers is not changed between the etching and the growth. The conveying apparatus is resistant to heat. Thus the hot wafers just treated with the $AsCl_3$ etching can easily be transferred to the growing chamber by the conveying apparatus, even if the etching chamber is different from the epitaxial chamber. If the wafers were taken out the conventional methods, the wafers must be cooled in the etching chamber and the wafers must be heated in the epitaxial chamber. The cycle of the cooling and heating would yield a great thermal stress In the wafers. This invention is immune from the thermal distortion.

(b) The interfaces are not revealed in the air and not polluted by oxygen, fumes or gases. When the buried layers have been grown epitaxially, the interfaces are free from oxides or pollutants. The clean interfaces ensure the good quality of the buried layer crystals.

The advantages of the present invention are now listed again collectively.

① The $AsCl_3$ etching produces rectangle-sectioned stripes with erect side surfaces, making the best use of the slowest etching speed on (0±1±1) planes. In the rectangle-sectioned stripes, the widths of the cap layers, the active layers, and the cladding layers are determined more rigorously than in the slanting stripes in which the widths would fluctuate by $\Delta e/\sin \theta$, where $\Delta e$ is an error of the depth of etching and $\theta$ is the slanting angle of the stripes. This fact enables the laser diodes produced by this invention to control the injection currents exactly.

② The rectangle stripes ensure the protection of the ends of the active layers. The definite dimension of the active layers will reduce the leak current and the fluctuation of the conversion efficiency from electricity to light.

③ Without being taken out of the vacuum into the air, the etched wafers can be transferred in vacuum to the reaction chambers for epitaxy and can be treated by the epitaxial process continually. The continual processes exclude the possibility of the contamination and the thermal distortion of the wafers, which enhances the quality of the crystals of the interfaces, when the buried layers are grown on the etched surfaces for producing laser diodes.

④ The epitaxial wafer contains both As and P, because the active layer is InGaAs or IngaAsP. Prevention of As and P from dissociating may require both arsenic compound and phosphorus compound. However, this Inventors have found the asymmetry between $AsCl_3$ and $PCl_3$. $AsCl_3$ can prevent P from escaping. $PCl_3$ cannot suppress As from dissolving. This invention exploits only $AsCl_3$ as an etchant, relying upon the asymmetry. Single component of the etchant simplifies the control of gas pressure and temperature, and the apparatus for gas supply.

DETAILED DESCRIPTION OF PREFERRED EMBODIMENTS

Figure 1:
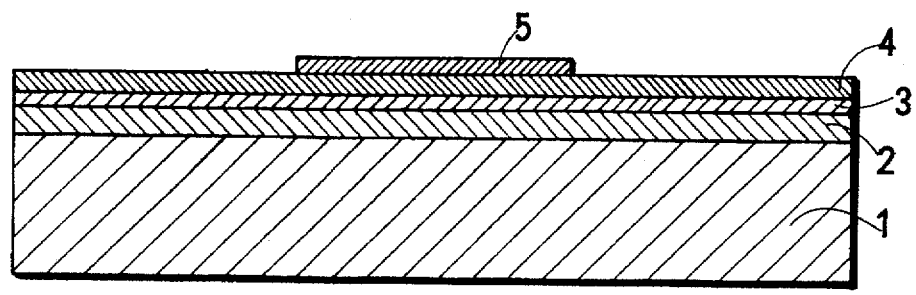
FIG. 1 is a sectional view of a unit of an InP epitaxial wafer containing an InP substrate, an n-type layer, an active layer, a p-type layer and a striped mask film selectively covering the epitaxial wafer.

The present invention proposes a method of processing an epitaxial InP wafer by etching the wafer by a gas of $AsCl_3$. At an earlier stage, the wafer is etched by the once-proposed "Br-methanol etchant" into normal-mesas, and the wafer is again etched by a $AsCl_3$ gas at the following stage. This invention is based upon the following two facts ① and ②.

① The Inventors have discovered the fact that when a compound semiconductor film is grown on a (111)B surface of a compound semiconductor substrate or layer by a chloride vapor deposition method, chloride atoms in the material gas remain in the growing semiconductor crystal and activate themselves as n-type impurities, and the carrier density is naturally determined by the remaining chloride atoms. The fact had been disclosed in Japanese Patent Application No. 5-45963 "Method of doping impurity into compound semiconductor" filed by the Inventors. The chloride vapor phase deposition method uses a material gas including chlorides of As, P, Ga or In. Chloride atoms play the role of transferring the composition elements As, P, Ga or In by making chlorides with the elements and by dissolving them at a high temperature. Almost all the chloride atoms are exhausted from the chamber, but a little portion of chloride atoms are taken into the growing crystal. Then the chloride atoms act as n-type impurities in the compound semiconductor. This fact has been discovered by the Inventors for the first time.

② The Inventors have noticed that when a semiconductor film is grown on a (111)A surface of a compound semiconductor substrate or layers, the revealed (111)A surface is likely to be damaged by heat during raising the temperature of the substrate or layers. (111)A surface is vulnerable to heat, since (111)A plane has only the atoms of group III which are likely be be oxidized. This is the reason of the occurrence of the thermal damage of (111)A surface. Actually, the revealed (111)A surface is likely to be injured by heat in the process of growing buried layers. On the contrary, (111)B surface is entirely immune from thermal damage. Furthermore, (111)B surface is endowed with the advantage of fact ① that (111)B surface absorbs chloride atoms as an n-type impurity.

A (111)B surface is superior to a (111)A surface in the heat resistance and the chloride auto-doping. However, the conventional "Br-methanol" etching reveals a (111)A plane as a final surface.

The Inventors paid attention to the clear difference between (111)A planes and (111)B planes. The use of a (111)B surface came to the Inventor's mind instead of a fragile but inactive (111)A surface. The Inventors thought that when a masked InP epitaxial wafer is etched into normal mesas instead of reverse mesas by the "Br-methanol" etchant, a (111)A plane appears at a temporary surface which forms side slopes of normal mesas, and if the wafer were etched further by some other etchants which can eliminate selectively the vulnerable (111)A surfaces, other damage-resistant planes would appear as other transient surfaces. And if the newly revealed surfaces were similar to (111)B planes, it would be very convenient to form the buried layers, because (111)B surfaces are resistant to heat. Thus, the problem has been confined to seek a method which is capable of etching a (111)A surface and revealing a plane similar to a (111) plane as a surface. What is the etchant for the purpose? Is there such an etchant or an etching way for accomplishing the purpose? The Inventors thought that (111)A surfaces could be eliminated by some etching at a high temperature, because (111)A surfaces are so vulnerable to heat and the etching by a chloride gas would be capable of revealing surfaces which are highly resistant to heat.

Examining various chemicals for an etchant, the Inventors have discovered arsenic trichloride ($AsCl_3$) as a suitable etchant from (111)A surfaces to the other stable surfaces in the end. $AsCl_3$ is a transparent liquid which fumes in the air. The melting point is $-16°$ C. The boiling point is $130°$ C. The density is 2.21 $g/cm^3$ at $0°$ C. A molecular is a tetrahedron. The distance between As and Cl is 0.217 nm. The angle $\angle ClAsCl$ is 98.6 degrees. The conductivity is $1.24\times10^{-6}$ S/cm. Dielectric constant is 12.8 at $20°$ C. $AsCl_3$ is soluble in chloric acid or in organic solvents. Hydrolysis of $AsCl_3$ produces $As(OH)_3+3HCl$.

The Inventors found out that $AsCl_3$ could etch away (111)A plane most rapidly among all crystallographical planes of InP crystal or the like. Thus, the etching by AsCl₃ can eliminate a (111)A surface and reveal another plane as a surface which is resistant to heat. The use of AsCl₃ features this invention.

Figure 2:
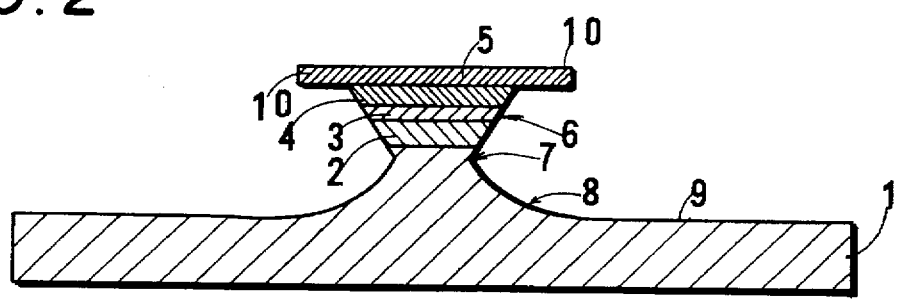
FIG. 2 is a sectional view of a unit of an InP epitaxial wafer etched into a revere-mesa below the protecting mask by the once proposed etchant containing bromine and methanol ($Br_2+CH_3OH$).
Figure 3:
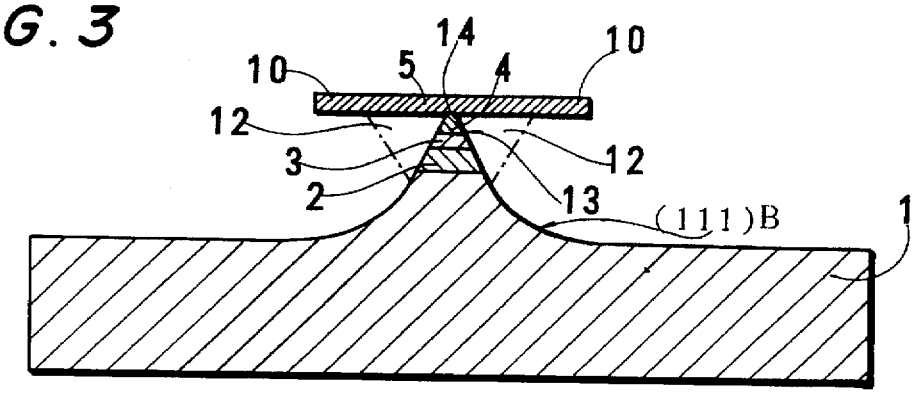
FIG. 3 is a sectional view of a unit of an imaginary epitaxial wafer which would be produced by etching the wafer of FIG. 2 further by a gas of $AsCl_3$ which this invention will propose as a new etchant for making novel sections of stripes.
Figure 4:
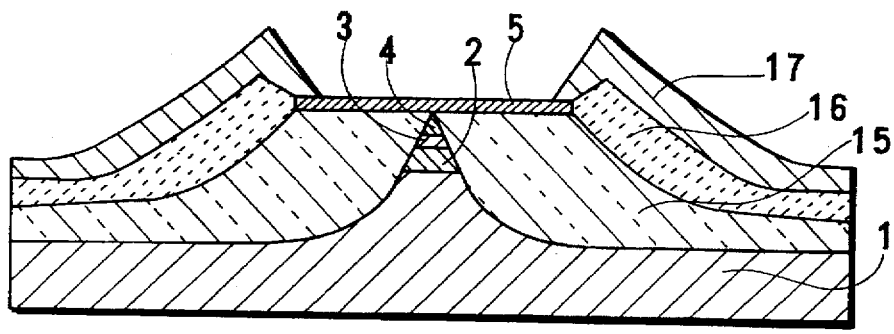
FIG. 4 is a sectional view of a unit of an imaginary epitaxial wafer which would be produced by growing side buried layers on the wafer of FIG. 3.

Another important matter is the direction of the mesa. The proposed methods had employed the reverse-mesa as the shape of the stripes, since the reverse-mesa ensures a narrow width of the active layer and a high current density of an injected current, as explained by referring to FIG. 1 and FIG. 2. The "Br-methanol" etches the crystals deeply till the underlying layers below the masks, and prepares (111)A surfaces under the stripes. If once revere-mesa etched stripes were again etched by AsCl₃, the (111)A surfaces would vanish and (111)B planes would appear. In the meantime the etching progresses fast in the direction orthogonal to (111)A planes. Then the underlying layers below the mask stripes would be too deeply removed by the second etching, as denoted in FIG. 3. The contact region (14) of the underlying crystal to the mask (5) would be too narrow to guarantee an enough area of a current flow. If other semiconductor layers (15), (16) and (17) were deposited on the etched vacancies, a multilayered device having buried layers would be produced, as shown in FIG. 4. Then the mask film (5) would be eliminated, and metal electrodes would be formed on the striped top and the bottom of the substrate (1). However, too narrow width of the contact would prevent a current from flowing through the contact, which would make the device inoperative. The Inventors noticed the incapability of etching the once reverse-mesa etched striped parts again by AsCl₃ by some trial experiments.

The Inventors have an idea for etching the striped parts into normal mesas by "Br-methanol etchant" instead of reverse-mesas, because reverse mesas allow almost all the parts of the stripes to remain below the stripe masks.

Figure 5:
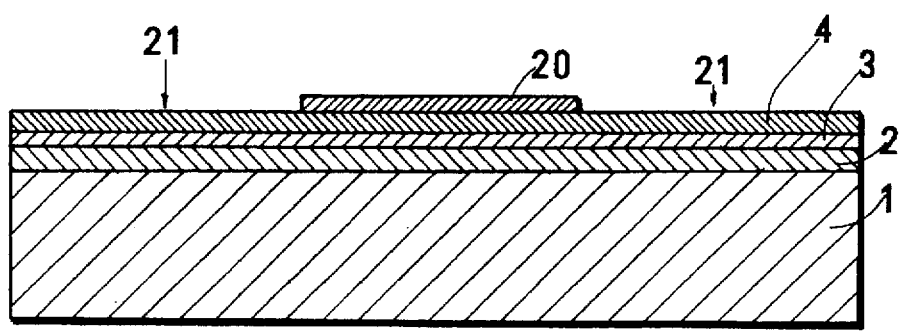
FIG. 5 is a sectional view of a unit of an InP epitaxial wafer containing an InP substrate, an n-type (or p-type) layer, an active layer, a p-type (or n-type) layer and a striped mask film selectively covering the epitaxial wafer, which shows the starting process of the method of the invention.

FIG. 5 to FIG. 8 demonstrate the processes of this invention. FIG. 5 shows a unit of an epitaxial wafer containing an n-type InP substrate (1), an n-type cladding layer (2), a non-doped or little-doped active layer (3), a p-type layers (4) and a protecting, mask film (20) made from SiN. FIG. 5 seems to be similar to FIG. 1. However, the structure of FIG. 5 is different from the structure of FIG. 1. The directions of the striped mask films (5) and (20) are different. The mask film (20) in FIG. 5 is orthogonal to the counterpart (5) in FIG. 1. This invention aims at shaping normal-mesas enclosed by (111)A planes under the striped masks. There are two groups of (111)A planes on a (100) wafer. One group (111)A is orthogonal to the other group (111)A on the surface (100). The inclinations of (111)A planes are different for the two groups. Then the orientation of the crystals of FIG. 5 is perpendicular to the orientation of the crystals of FIG. 1, if both the stripes (20) and (5) extend in the direction perpendicular to the paper.

When a rectangular mask whose sides are parallel with directions <0+1−1> and <0−1−1> is formed on a (100) InP wafer, a pair of parallel sides <0−1−1> are etched into a reverse-mesa and the other pair of parallel sides <0+1−1> are otherwise etched into a normal-mesa due to the crystallographical symmetry of zinc blend type structure. Here, round bracketed (lmn) designates a set of planes which are supposed to be arranged in parallel with a common distance in a crystal. The bracketed integers l, m and n are called plane indexes or Miller indexes. The segments with a-axis, b-axis and c-axis of a first plane are 1/l, 1/m and 1/n respectively. Edged bracketed <lmn> denotes a direction normal to a (lmn) plane. The indexes l, m and n are positive or negative integers. Negative sign was used to be suffixed at a top of the integer in crystallography. But negative signs are here indicated in front of the integers from the restriction of typing. The distinction between a normal-mesa and a reverse-mesa is caused from the anisotropy of the symmetry (−43 m or Td in cubic) of the compound semiconductor of zinc blend type.

Figure 9:
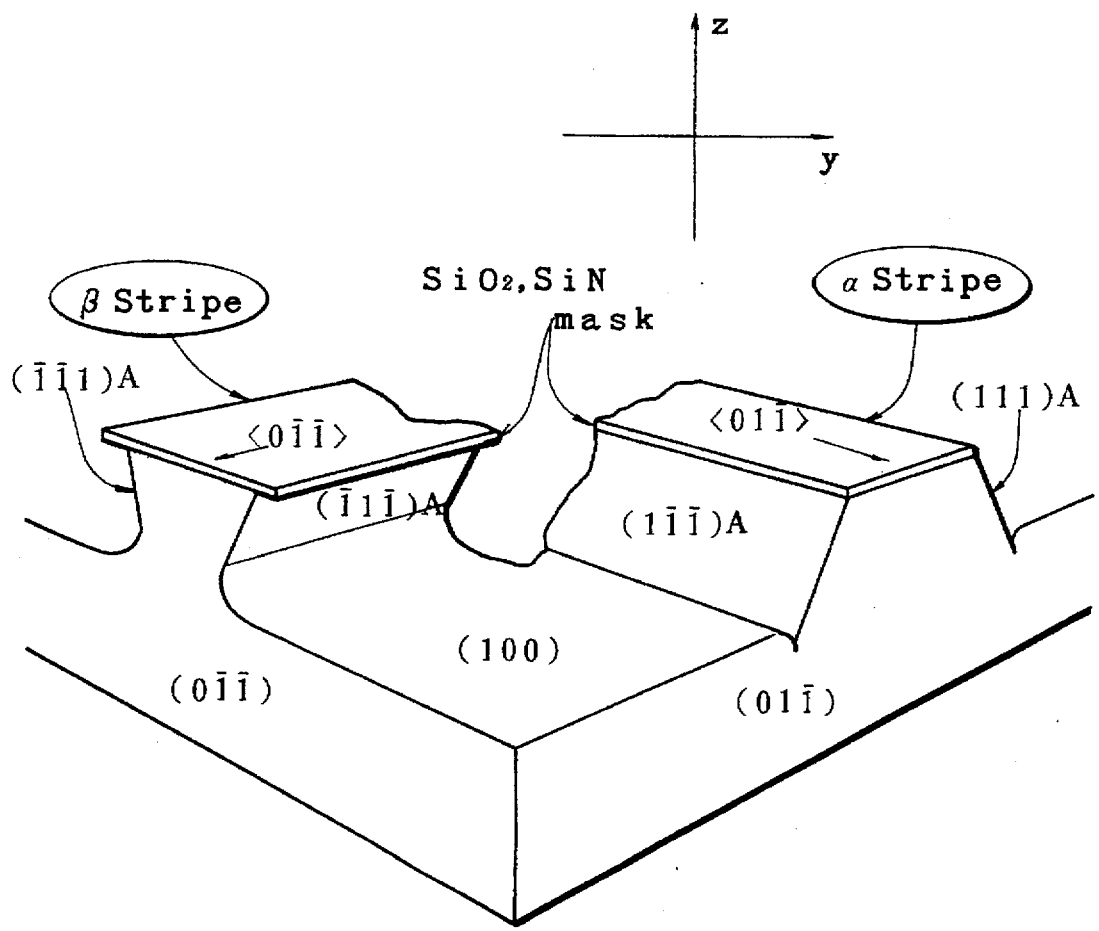
FIG. 9 is a perspective view of mesa-etched surface of an InP (100) epitaxial wafer which is partially covered with two kinds of stripes orthogonal with each other for clarifying the formation of a normal-mesa and a reverse-mesa by the directions of the stripes.

FIG. 9 demonstrates the formation of a normal mesa and a reverse-mesa. The compound semiconductor layer (or substrate) crystal has a (100) surface. There are two kinds of cleavage planes (0+1+1), (0−1−1) and (0+1−1), (0−1+1) which are perpendicular to each other and to the (100) surface. Thus, two directions of cleavage are denoted by <0−1+1> (or <0+1−1>) and <0−1−1> (or <0+1+1>). Individual device chips will be scribed along cleavage lines. Thus the stripe masks are selectively formed with a resist by photolithography in the directions of cleavage. There are two alternatives for the direction of the mask stripes. One kind (α) of stripes is in parallel with <0+1−1> (equivalent to <0−1+1>). The other kind (β) of stripes are in parallel with <0−1−1> (equivalent to <0+1+1>).

Integrated expression {111} planes mean eight individual planes (±1±1±1). {111} planes must be divided into two groups by the difference whether the product lmn is +1 or −1. Four planes of lmn=−1((+1−1+1), (−1+1+1), (+1+1−1) and (−1−1−1)) are equivalent on crystallography. Other four planes of lmn=+1 ((−1−1+1), (−1+1−1), (+1−1−1) and (+1+1+1)) are also equivalent. The lmn=−1 planes are, however, different from the lmn=+1 planes. The "Br-methanol" etches the crystal till one of the lmn=+1 planes of {111} reveals due to the anisotropic etching speeds. Two 1 mn=−1 planes of {111}, which are called (111)B planes, obliquely extend from the sides of the stripes α and β. Thus a (111)A plane inclines at 70 degrees to a (111)B plane. However, the stripes α and β have different planes belonging to {111} on their sides, because the two stripes are orthogonal with each other.

Stripe α has an end surface (0+1−1). The accompanying lmn=+1 planes of {111} ((111)A planes) should be perpendicular to (0+1−1). Thus stripe α has two side surfaces (+1+1+1) and (+1−1−1) belonging to {111}((111)A). The "Br-methanol" etching stops at {111}A plane. Therefore, α stripe has two subsidiary planes (+1+1+1) and (+1−1−1) on the side. The cosine between <100> and <+1−1−1> (or <+1+1+1>) is 3^{−½}. Thus the angle between stripe α and (+1−1−1) is 126 degrees, an obtuse angle. Then stripe α makes a normal-mesa.

Similarly, stripe β has an end surface (0−1−1). Stripe β has two subsidiary planes (−1+1−1) and (−1−1+1) ((111)A planes) on the sides. All the subsidiary planes satisfy the equivalent condition of lmn=+1 for (111)A. The cosine between <100> and <−1+1−1> is −3^{1/2}. Thus the angle between stripe β and (−1+1−1) is 54 degrees, an acute angle. Thus stripe β produces a reverse-mesa.

The explanation has clarified that the formation of a normal-mesa or a reverse-mesa depends on the direction of the stripes. The occurrence of a normal-mesa or a reverse-mesa is not accidental at all. The direction of the stripe determines the kind of mesas exclusively. Prior proposed methods had adopted stripe β for shaping reverse-mesas.

This invention adopts normal-mesas as the sectional shape of stripes by selecting stripe α which enables "Br-methanol" to etch the compound semiconductor crystal into normal-mesas below the stripe masks. The speed of etching of "Br-methanol" is the fastest on (111)A surfaces among all the crystallographical planes. Finally, (111)A planes reveal as surfaces below the masks. The normal-mesa which has a wider bottom than a top suppresses the side etching which means a horizontal, deep etching of underlying layers below the mask. The stripe is accompanied by broad slopes on both sides in the normal-mesa.

The elimination of the side etching brings about some profits. If the side etching were prevailing like in the prior method, the eaves of masks projecting on both sides would be left on the stripes. The eaves of masks would impede a semiconductor material from depositing on the side parts below the eaves in the following epitaxy of buried layers. Cavities may be produced under the projecting eaves in the epitaxial process. To avoid the non-uniform deposition of the buried layers, the eaves of masks would have to be eliminated before the epitaxy of the buried layers. The elimination of eaves would cause a great inconvenience by increasing the processes. Besides, the removal of eaves would demand the steps of taking the wafer out of the chamber into the air, dipping the wafer into fluoric acid, and dissolving only the side portions (eaves) of the SiN protection films without impairing the central, necessary parts of the mask films. The additional process of removal of the eaves would make it impossible to carry out the etching process and the burying process continually in the same apparatus. The difficulties derived from the formation of reverse-mesas.

On the contrary, this invention need not eliminate the caves of the masks, because this invention makes normal-mesas which yield no caves of the masks by suppressing effectively the side etching of the striped parts. Owing to the omission of the process in the air, this invention succeeds in performing the etching process and the epitaxial process continually in the same vacuum apparatus, whereby this invention can shorten the time of processing.

Besides the decrease of fabrication time, the continual proceeding of the etching and the epitaxy gives another advantage to this invention. If the etched wafer were gotten rid of from the reaction chamber to the air, the wafer would be contaminated by oxygen, gases, water or other chemicals. The contamination would abase the quality of the wafer. Thus the continual proceeding allows this invention to fabricate epitaxial wafers of high quality.

Figure 6:
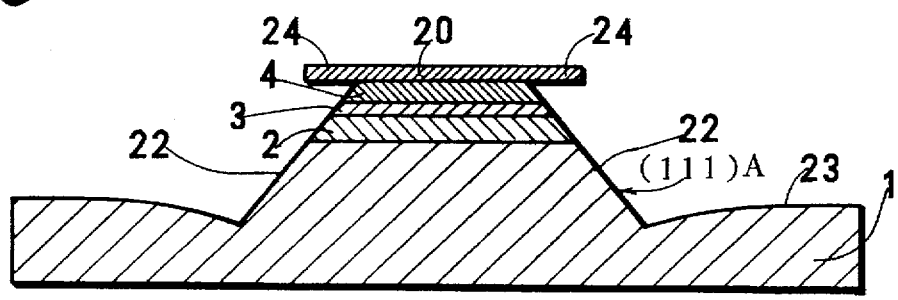
FIG. 6 is a sectional view of a unit of an InP epitaxial wafer etched into a normal-mesa below the protecting mask by the conventional etchant of bromine and methanol, which demonstrates the second step of the invention.
Figure 7:
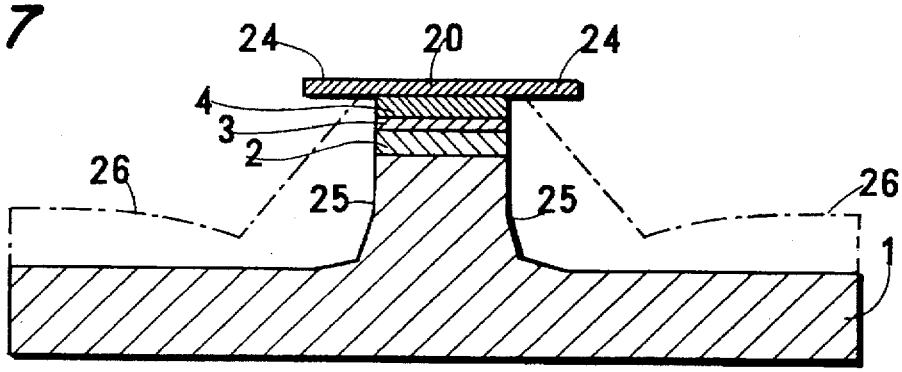
FIG. 7 is a sectional view of a unit of an InP epitaxial wafer which is obtained by etching the wafer of FIG. 6 further by a gaseous etchant of $AsCl_3$, which denotes the third step of the method of the invention.
Figure 8:
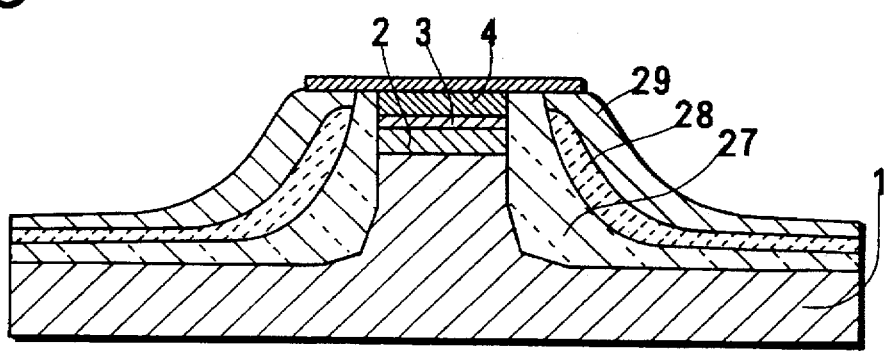
FIG. 8 is a sectional view of a unit of an InP epitaxial wafer which is produced by growing buried layers on the wafer of FIG. 7, which designates the fourth step of the method of the invention.

Conventionally the etching process had been ended up with the "Br-methanol" etching. This invention etches an initial epitaxial wafer into normal-mesas by "Br-methanol etchant". FIG. 6 demonstrates the section after the "Br-methanol" etching. The mesas have (111)A surfaces which are vulnerable to heat on the sides. This invention further etches the once "Br-methanol"-etched wafer having normal-mesas with arsenic trichloride $AsCl_3$. FIG. 7 shows the section of a unit of the wafer after the $AsCl_3$ vapor etching. The $AsCl_3$ reveals (0±1±1) planes as surfaces which are orthogonal to (100) surface beneath the striped masks. The etching by $AsCl_3$ is carried out in a furnace. The wafer is etched in a gas prepared by dissolving $AsCl_3$ in hydrogen gas flow by heat. Since $AsCl_3$ is liquid at a low temperature, heated hydrogen gas evaporates $AsCl_3$ into a mixture gas. Then semiconductor layers are grown on both sides by epitaxy. FIG. 8 shows the section of a unit of the wafer after the epitaxy of the buried layers.

The etching of $AsCl_3$ characterizes this invention. Thus the reason why this invention chooses $AsCl_3$ as an etchant is now clarified in more detail. The problem is what material should be adopted to etch the (111)A surfaces revealed by "Br-methanol" etching. It is a common sense to employ a gas including group V element for heat processing of group III–V semiconductors, because atoms of group V are likely to escape from the surfaces of the semiconductors and a gas of group V suppresses the same element of group V from dissociation. Skilled ones may think of hydrides of group V element, for example, arsine ($AsH_3$) or phosphine ($PH_3$), because the hydrides are vapor at room temperature. Harrous et al. suggested the use of phosphine $PH_3$ of InP as an etchant. M. Harrous, J. L. Laporte, M. Cadoret, C. Pariset & R. Cadoret, "EFFECT OF PHOSPHINE DECOMPOSITION ON THE GROWTH AND SUBSTRATE HEATING OF (100) InP IN THE HYDRIDE METHOD", J.Cry-.Growth 83 (1987)p279–285.

These hydrides of group V elements are deadly poisons. First of all, the hydrides are dangerous for the workers. Further, the prevention of pollution requires a vast investment to the apparatuses. It is preferable to avoid such highly poisonous gases. The Inventors want to select safer chemicals as etchants.

Otherwise some persons may think of a dissolved phosphorus trichloride ($PCl_3$) gas, because the purpose is to etch the crystals whose main compound is InP. Chlorides of phosphorus are, in general, far safer than hydrides of phosphorus. In fact, phosphorus trichloride $PCl_3$ has sometimes been used as an etchant of InP. As written before, group V element has a tendency to dissociate from a compound at a high temperature because of the high vapor pressure. Phosphorus P is the main component of group V in InP. Therefore $PCl_3$, chloride of phosphorus, may be deemed to be the best etchant for InP crystals, because $PCl_3$ would impede P atoms from escaping from the surfaces of InP crystals. Since $PCl_3$ is liquid at room temperature, it would be better to heat and dissolve $PCl_3$ into vapor in hydrogen gas ($6H_2+4PCl_3 \rightarrow P_4+12HCl$). $PCl_3$ may be a promising applicant.

Nevertheless, the semiconductor layers this invention try to treat contain not only phosphorus but also arsenic as group V element. Indeed the substrate InP includes only P. However, epitaxial layers include mixture crystals, InGaAs, InGaAsP, etc. which contain As as well as P as group V elements. Therefore it is questionable whether $PCl_3$ would sufficiently prevent As atoms from subliming (evaporating or thermally-dissolving) from the mixture crystal of InGaAsP.

A mixture of $AsCl_3$ and $PCl_3$ may be deemed to be the best candidate, since the etchant shall etch an epitaxial wafer containing an InP substrate and InGaAs or InGaAsP layer. The mixture ($AsCl_3+PCl_3$) will effectively forbid As and P from escaping out of the mother crystals. The employment of two gases, however, would complicate the pipelines of gas supplying system and increase the difficulty of controlling due to the increment of controlling parameters.

The Inventors thought that the etchant need not include both As and P for the prevention of As and P from dissociating perhaps, but there may be a special condition which allows a minimum-component gas to etch the compound crystal without the dissociation of the volatile elements As and P.

Is there such an etchant which satisfies the requirement? What is the etchant then? Nothing but experiments teaches us answers for such questions. The Inventors prepared an InP wafer on which an InGaAs layer had been deposited epitaxially. The surface of the wafer was selectively etched till both InP crystals and InGaAs crystals appeared on the same surface. Then the sample wafer having InP parts and InGaAs parts on the surface was etched either by a thermally dissolved gas of $AsCl_3$ or by a thermally dissolved gas of $PCl_3$.

The etching by the thermally dissolved $PCl_3$ gas was capable of converting InP parts into mirror surfaces but was unable to convert InGaAs parts into mirror surfaces. Even eye observation could find out white muddiness appearing on InGaAS parts. An optical microscope observation clearly revealed ruggedness pervading the InGaAs parts. This result taught us the impotent of a phosphorus chloride gas for etching a mixture crystal containing arsenic As. Then the Inventors abandoned $PCl_3$ as an etchant material for the epitaxial wafers.

When the sample wafer was etched by a thermally dissolved $AsCl_3$ gas, both InP parts and InGaAs parts were completely mirror-etched. The surfaces were so smooth that the Inventors could scarcely discern the etched wafer from the original epitaxial mirror wafer. The result means that both InP and InGaAs are not damaged by $AsCl_3$ which contains no phosphorus.

The fact signifies that the thermally dissolved $AsCl_3$ gas has an ability of preventing not only As but also P from dissociating (evaporating or escaping). These experiments clarified the asymmetry of the roles of chlorides of As and P for hindering As and P from evaporation for the first time. The newly discovered property of the chlorides was truly favorable for the Inventors. Namely the fact signifies that the etching of an epitaxial wafer Including As and P does not require the use of a mixture etchant containing both arsenic chloride and phosphorus chloride. Arsenic chloride proved itself to be the best etchant for the crystals including both As and P.

Taking advantage of the property of $AsCl_3$, the Inventors fabricated InP burying type hetero-junction lasers. Epitaxial wafers with an InP substrate, an n-type InP cladding layer, an InGaAsP active layer and a p-type InP layer were starting materials. SiN (or $SiO_2$) mask films were formed in stripes In the direction which allows the mask films to form normal-mesas on the p-type layer of the wafers. Then the wafers were etched by the etchant "Br-methanol", a mixture of bromide and methanol. Normal-mesas were formed on the wafers by the "Br-methanol" etching. The eaves of striped films were eliminated. Then the wafers were set on a susceptor in a chloride VPE (vapor phase epitaxy) furnace and were etched by a thermally dissolved $AsCl_3$ gas. Further InP buried layers were grown on the sides of stripes. The buried layers were proved to have a good crystallization.

[EMBODIMENT]

Long wavelength burying type semiconductor lasers were produced by utilizing the method of this invention. Double-hetero epitaxial layers were grown on InP substrates having a (100) just surface by the OMVPE method (Organometallic Vapor Phase Epitaxy). The active layer was InGaAsP which will generate light of a 1.3 μm wavelength. The (100) just surface means the surface not inclined from (100) plane at all. FIG. 5 shows the section of a unit of the epitaxial wafer having an n-InP substrate (1), an n-cladding layer (2), an active layer (3) and a p-type layer (4) which includes a cladding layer and a cap layer.

The epitaxial wafers were coated with SiN protecting films by the P-CVD method. The SiN films were etched into many parallel lines (stripes) with a 5 μm breadth by photo-lithography. The direction of the stripes (20) was the direction which would make normal-mesas at the stripes by the "Br-methanol" etching.

A first mesa-etching process etched the wafers selectively protected by the striped masks with the etchant "Br-methanol" (e.g. 0.4 wt % $Br_2$:$CH_3OH$) which contained 0.4 wt % of bromine ($Br_2$) and 99.6 wt % of methanol ($CH_3OH$). The weight % of bromine $Br_2$ is from 0.1 wt % to 6 wt % in general. The parts (21) without masks were solved and removed by the etching. The surfaces (23) of the substrate appeared. The parts under the stripes were formed into normal mesas having (111)A surfaces (22), as shown in FIG. 6. The protecting masks had small eaves (24) on the sides.

The "Br-methanol"-etched wafers were carried into a chloride epitaxial furnace which can grow InP crystals in vapor phase from a material including chloride. The chloride epitaxial furnace has a plurality of growing chambers connected to each other by conduits in horizontal directions. The conduits have gate valves. All the chambers and the conduits can be made vacuous. By closing gate valves of both sides, any reaction chamber can be isolated from the common space. A conveyer apparatus can carry wafers from a chamber to another chamber. After the wafers had been stored in a first chamber of the furnace, the furnace and the wafers were heated. A mixture gas ($As_4$+HCl) had been prepared by dissolving arsenic trichloride ($AsCl_3$) thermally in hydrogen gas ($4AsCl_3 + 6H_2 = As_4 + 12HCl$). The mixture gas was introduced into the first chamber. The gas ($As_4$+ HCl) etched the normal mesas further till the mesas were thinned to vertical side surfaces (25), as shown in FIG. 7. Doted lines (26) shows the sections which have been removed by the $AsCl_3$ etching. In the state, since the striped crystal had nearly parallel vertical surfaces, the top p-type layer (4), the active layer (3) and the n-type layer (2) have nearly the same breadth, as shown in FIG. 3.

The wafers were transferred in conduits to a second growing chamber by the conveyer apparatus without once being taken out of the chamber into the air. The conveyance by the conveyer apparatus excluded the probability of contamination of the wafers. The conveyance further dispensed with the waiting time till the wafers were cooled enough to be gotten out in the atmosphere, because the apparatus could carry the hot wafers without contact with the hot material gas. The epitaxy was started in the second growing chamber. The growths of different buried layers (27), (28) and (29) were carried out in different reaction chambers. FIG. 8 demonstrates the section of a unit of the wafer after the deposition of the buried layers. The innermost layers (27) sandwich the erect striped parts of crystals. The ends of the buried layers are in contact with the bottom of the mask films (20). Nothing grows on the protecting films (20), since the masks have the function of prohibiting the crystal growth thereon. Therefore, the materials of the epitaxial layers are selectively deposited only on the parts not covered with the mask films (20).

After the buried layers had been grown, the wafers were gotten out of the reaction chamber. The protecting SiN layers were removed from the tops of the stripe layers by the etching with fluoric acid. Then the underlying crystal layers appeared at the stripes.

The wafers were again brought into the growing furnace. Contact layers of compound semiconductor were deposited on the revealed stripes for fabricating ohmic contacts of low resistance with electrodes at the following process. All of the processes of crystal growths were ended thereby.

A part of the grown crystal was cracked for revealing a section. The section of the wafer was observed by a SEM (Scanning Electron Microscope). The mesas stood erect, as shown in FIG. 8. The buried layers were smoothly piled on the vertical sides of the mesas. All the ends of the cladding layers (2), the activation layers (3) and the cladding/cap layers (4) were entirely protected by the innermost epitaxial layer (27). The condition of the interfaces between the mesas and the buried layers were good, because the sides of the mesas were not rugged unlike conventional ones. The shape and the interface of the mesas were capable of controlling injection currents. Then ohmic electrodes were formed on the mesas and the bottoms. Then the wafer was scribed along cleavage lines into individual device chips. Each device chip was mounted on a package with leads. The leads were connected to the electrode by wires. The packages were sealed with caps in vacuum.

The electric properties of laser diodes fabricated were examined. The fluctuations of threshold currents and temperature dependence of properties of the lasers produced on the same wafer were less than that of prior InP lasers. Since the crystallographical properties at the interfaces between the mesas and the buried layers aide superior to the prior ones, the fluctuations of the threshold and the temperature dependence are improved by this invention.

What we claim is:

1. A method of processing an epitaxial wafer of InP or the like comprising the steps of:

forming striped protecting mask films selectively on an epitaxial wafer containing an InP crystal substrate, an InP cladding layer, an InP capping layer, and a crystal layer selected from at least one member of the group consisting of InP, InGaAs and InGaAsP;

etching parts uncovered by the protecting mask films by a mixture etchant of bromine and methanol until parts under the protecting mask films are transformed into normal-mesas having wider bottoms and narrower tops with tapered side surfaces;

etching the wafer by a thermally dissolved $AsCl_3$ gas;

shaping protrusions under the protecting mask films into rectangular sections having erect side surfaces; and growing buried layers of InP.

2. A method as claimed in claim 1, wherein the mixture etchant of bromine and methanol contains 0.1 wt % to 6 wt % of bromine and 99.9 wt % to 94 wt % methanol.

3. A method as claimed in claim 1, wherein the epitaxial wafer has a (100) surface of InP.

4. A method as claimed in claim 3, wherein the normal-mesas etched by the mixture etchant have (111)A surfaces.

5. A method as claimed in claim 4, wherein the protrusions etched by $AsCl_3$ gas have two surfaces of (011) and (0–1–1) which are orthogonal to the wafer surface (100).

6. A method as claimed in claim 5, further comprising the steps of carrying the wafers etched by $AsCl_3$ from a chamber of etching to a chamber of growing the buried layers and preventing contact between said wafers and outside air during said carrying step.

7. A method as claimed in claim 6, wherein the buried layers are grown by chloride vapor phase epitaxy which employs chlorides of As and P as materials.

8. A method as claimed in claim 7, wherein the beginning epitaxial wafer has a n-type (100) InP substrate, an n-type InP cladding layer, a non-doped or lightly doped active layer, a p-type InP cladding layer, and a p-type cap layer.

9. A method as claimed in claim 7, wherein the beginning epitaxial wafer has a p-type (100) InP substrate, an p-type InP cladding layer, a non-doped or lightly doped active layer, a n-type InP cladding layer, and a n-type cap layer.

10. A method of processing an epitaxial wafer of InP or the like comprising the steps of:

forming striped protecting mask films selectively on an epitaxial wafer containing an InP crystal substrate, an InP cladding layer, an InP capping layer, and a crystal layer selected from at least one member of the group consisting of InP, InGaAs and InGaAsP;

etching parts uncovered by the protecting mask films by a first etchant until parts under the protecting mask films are transformed into protrusions having wider bottoms and narrower tops with tapered side surfaces;

etching the wafer by a thermally dissolved $AsCl_3$ gas;

shaping the protrusions under the striped mask films into rectangular sections having erect side surfaces; and growing buried layers of InP.

11. A method as claimed in claim 10, wherein the first etchant is one of HBr alone, $HBr+H_2O_2+H_2O$, $HBr+CH_3COOH+H_2O$, $HBr+H_3PO_4+H_2O$ and $HBr+HNO_3+H_2O$.

* * * * *